US012712582B2

(12) United States Patent
Fagg

(10) Patent No.: US 12,712,582 B2
(45) Date of Patent: Aug. 18, 2026

(54) TRANSCONDUCTOR WITH ADAPTIVE BIAS OFFSET CANCELLATION

(71) Applicant: Renesas Electronics America Inc., Milpitas, CA (US)

(72) Inventor: Russell Fagg, Tempe, AZ (US)

(73) Assignee: Renesas Electronics America Inc., Milpitas, CA (US)

( * ) Notice: Subject to any disclaimer, the term of this patent is extended or adjusted under 35 U.S.C. 154(b) by 204 days.

(21) Appl. No.: 18/808,434

(22) Filed: Aug. 19, 2024

(65) Prior Publication Data

US 2026/0051915 A1 Feb. 19, 2026

(51) Int. Cl.

*H04B 1/04* (2006.01)
*H03D 7/14* (2006.01)
*H04B 1/12* (2006.01)

(52) U.S. Cl.

CPC ........... *H04B 1/123* (2013.01); *H03D 7/1441* (2013.01); *H03D 7/1458* (2013.01); *H04B 1/04* (2013.01); *H04B 2001/0416* (2013.01)

(58) Field of Classification Search

CPC .. H04B 1/123; H04B 1/04; H04B 2001/0416; H03D 7/1441; H03D 7/1458; H03L 7/087; H03L 7/0891; H03L 7/091; H03L 7/18; H03L 7/22

See application file for complete search history.

(56) References Cited

U.S. PATENT DOCUMENTS 11,489,532 B2 * 11/2022 Périn ...................... H03L 7/097
2024/0313792 A1 * 9/2024 Moslehi Bajestan ... H03L 7/093

* cited by examiner

*Primary Examiner* — Alison Slater

(74) *Attorney, Agent, or Firm* — SCULLY, SCOTT, MURPHY & PRESSER, P.C.

(57) ABSTRACT

Semiconductor devices for synchronizing networks are described. The semiconductor device includes a timing circuit having a sub-sampling phase lock loop. The sub-sampling phase lock loop includes a radio frequency sampler circuit that is configured to generate at least one error signal corresponding to a phase difference between an output signal of a voltage-controlled oscillator and a reference signal and a transconductor circuit that is configured to generate a tuning signal based on the at least one error signal. The tuning signal is configured to tune the voltage-controlled oscillator. The sub-sampling phase lock loop further includes an adaptive bias circuit that is configured to generate a nulling signal based on an offset in the tuning signal created by the transconductor circuit and provide the nulling signal to the transconductor circuit. The transconductor circuit is configured to adjust the tuning signal based on the nulling signal.

20 Claims, 5 Drawing Sheets

100

TRANSCONDUCTOR WITH ADAPTIVE BIAS OFFSET CANCELLATION

BACKGROUND

The present disclosure relates in general to semiconductor devices implementing a timing circuit, and more particularly, a timing circuit having a transconductor with adaptive bias offset cancellation.

A timing circuit including transceivers and clock circuits can be connected to multiple networks to synchronize the multiple networks. The timing circuit can include a phase-locked loop (PLL) which may include a phase detector, charge pump, loop filter, feedback dividers, and voltage-controlled oscillator (VCO) in a feedback loop.

PLLs sometimes rely on a feedback divider to frequency and phase lock a VCO to a reference frequency but may suffer from several shortcomings. For example, in such a PLL, the feedback divider power consumption scales with the VCO frequency and may become a significant noise source. In practice, the feedback divider's size and power consumption increase for higher VCO frequencies and tighter phase noise requirements.

In a fractional N PLL, the quantization noise from the randomization of the feedback divider ratio is shaped by a Delta Sigma Modulator (DSM) so that it may be filtered by the PLL's low pass filter response. Higher order modulators provide superior noise shaping but place increasingly stringent requirements on the linearity of the Phase Frequency Detector (PFD) and charge pump. Circuit non-linearities produce folding of the high frequency shaped noise in-band where it will contribute to the integrated jitter of the PLL. The PFD and charge pump can be linearized by offsetting the charge pump to only source current into the loop filter. This avoids the non-linearity arising from static and dynamic mismatches between the charge pump's source and sink currents but increases the charge pump and PFD noise and the PLL's reference spur.

The gain and noise of a PLL is typically limited by the gain of the PFD and charge pump and the feedback divider ratio. The charge pump gain can be increased by increasing biasing currents which necessitates larger devices within the charge pump to support a given VCO control voltage range. Scaling up the charge pump devices typically necessitates scaling up the PFD devices, substantially increasing the power consumption of the PLL at higher reference frequencies.

SUMMARY

In one embodiment, a semiconductor device comprising a timing circuit is disclosed. The timing circuit comprises a sub-sampling phase lock loop. The sub-sampling phase lock loop comprises a radio frequency sampler circuit that is configured to generate at least one error signal corresponding to a phase difference between an output signal of a voltage-controlled oscillator and a reference signal and a transconductor circuit that is configured to generate a tuning signal based on the at least one error signal. The tuning signal is configured to tune the voltage-controlled oscillator. The sub-sampling phase lock loop further comprises an adaptive bias circuit that is configured to generate a nulling signal based on an offset in the tuning signal created by the transconductor circuit and provide the nulling signal to the transconductor circuit. The transconductor circuit is configured to adjust the tuning signal based on the nulling signal.

In one embodiment, a timing circuit is disclosed. The timing circuit comprises a transconductor circuit that is configured to generate a tuning signal based on at least one error signal corresponding to a phase difference between a reference signal and an output signal of a voltage-controlled oscillator. The tuning signal is configured to tune the voltage-controlled oscillator. The timing circuit further comprises an adaptive bias circuit that is configured to generate a nulling signal based on an offset in the tuning signal created by the transconductor circuit and provide the nulling signal to the transconductor circuit. The transconductor circuit is configured to adjust the tuning signal based on the nulling signal.

In one embodiment, a semiconductor device comprising a phase lock loop of a timing circuit is disclosed. The phase lock loop comprises a voltage-controlled oscillator that is configured to generate an output signal of the phase lock loop and a sub-sampling phase lock loop. The sub-sampling phase lock loop comprises a radio frequency sampler circuit that is configured to obtain the output signal of the voltage-controlled oscillator and a reference signal and to generate a pair of error signals corresponding to a phase difference between the output signal and the reference signal. The sub-sampling phase lock loop further comprises a transconductor circuit comprising a gain stage that is configured to generate a gain signal based on the pair of error signals, a current mirror that is configured to generate a mirrored signal and an output stage that is configured to generate a tuning signal based on the mirrored signal and the reference signal. The voltage-controlled oscillator is configured to generate the output signal based on the tuning signal. The sub-sampling phase lock loop further comprises an adaptive bias circuit comprising a replica output stage. The replica output stage is configured to generate a replica signal based on the mirrored signal. The adaptive bias circuit further comprises a gain stage that is configured to generate an offset signal based on the tuning signal and the replica signal, a low pass filter that is configured to generate a filtered signal based on the offset signal and an output stage that is configured to generate a nulling signal based on the filtered signal. The current mirror is configured to generate the mirrored signal based on a current of the nulling signal and a current of the gain signal.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
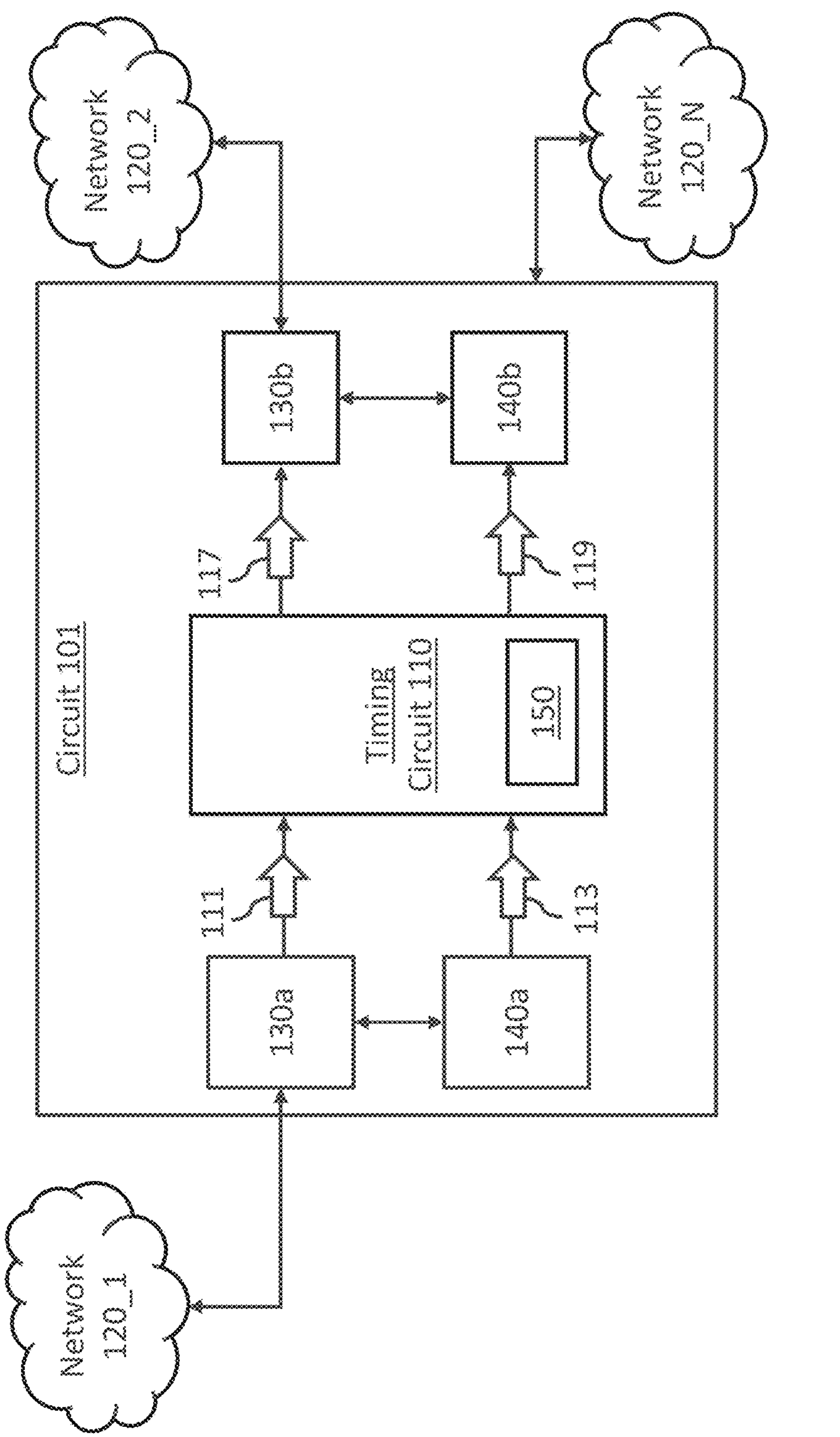
FIG. 1 is a block diagram of an example system that can implement a timing circuit in one embodiment.

FIG. 1 is a block diagram of an example system 100 that can implement a timing circuit 110 having a transconductor with adaptive bias offset cancellation in one embodiment.

System 100 can include a network circuit 101 and a plurality of networks, or N networks 120_1, 120_2, . . . , 120_N. Network circuit 101 can be an integrated circuit (IC) implement a telecommunications circuit. In an example, the circuit 101 may be implemented as a single IC or as a number of ICs on a printed circuit board (e.g., a network card, server blade, etc.). By way of example, network circuit 101 can implement a portion of a telecommunications network circuit. In another example, network circuit 101 can be implemented as one or more components of a Synchronous Ethernet (e.g., SyncE) switch and/or a router box (e.g., telecommunications device). System 100 can be implemented to synchronize multiple networks (e.g., two or more) 120_1-120_N. The number of networks 120_1 to 120_N can be arbitrary depending on a desired implementation of system 100.

In examples where network circuit 101 is being implemented as a switch and/or router, such as a SyncE switch and/or router. network circuit 101 can include one or more transceivers, such as transceivers 130*a*, 130*b*, one or more precision timing protocol (PTP) modules, such as PTP modules 140*a*, 140*b*, and a timing circuit 110. Each one of transceivers 130*a*, 130*b* can be, for example, an Ethernet physical layer transceiver chip. In an example shown in FIG. 1, network 20*a* can be connected to transceiver 130*a* and network 20*b* can be connected to transceiver 130*b*. Transceiver 130*a* can be connected to PTP module 140*a* and timing circuit 110. Transceiver 130*b* can be connected to PTP module 140*b* and timing circuit 110. Transceiver 130*a* can be configured to send data to, and/or receive data from, network 120_1, PTP module 140*a* and timing circuit 110. Transceiver 130*b* can be configured to send data to, and/or receive data from, network 120_2, PTP module 140*b* and timing circuit 110. Each one of transceivers 130*a*, 130*b* can be configured to generate and/or receive a clock signal under the SyncE protocol.

Timing circuit 110 can implement a network card and/or a network circuit board. Timing circuit 110 can be configured to synchronize a timing of communication signals transmitted and/or received using one or more communication protocols. In some embodiments, the timing circuit 110 can be implemented as a component of a SyncE router and/or switch (e.g., circuit 101). In one example, timing circuit 110 can be used to implement a synchronous Ethernet Wide Area Network (WAN). In some embodiments, timing circuit 110 can be implemented to facilitate synchronous communication in a digital subscriber line access multiplexer (DSLAM). In an aspect, transceivers 130*a*, 130*b*, PTP modules 140*a*, 140*b*, and/or timing circuit 110 can be deployed throughout a telecommunications network. In one example, the transceivers 130*a*, 130*b*, the PTP modules 140*a*, 140*b* and/or the timing circuit 110 can be deployed in a road-side cabinet and/or a server rack. In examples where network circuit 101 implements a SyncE switch and/or router box, networks 120_1 to 120_N can be coupled to one another.

In an example, networks 120_1 to 120_N can implement a number of local area networks (LANs) having operations that may be synchronized with one another. In various embodiments, networks 120_1 to 120_N can include networks based on time division multiplexing (TDM) (e.g., synchronous optical networks (SONET), synchronous digital hierarchy (SDH) network, or plesiochronous digital hierarchy (PDH) networks), and/or Ethernet-based packet networks. The networks 120_1 to 120_N can be configured to facilitate delivery of a variety of communication services. Each one of PTP modules 140*a*, 140*b* can implement an IEEE 1588 compliant packet-based timing scheme. In an example, PTP module 140*a* can implement a slave clock and PTP module 140*b* can implement a master clock, thus PTP module 140*b* has a higher hierarchy than PTP module 140*a*. PTP module 140*b* can initiate transmission of synchronization messages to slave clocks (e.g., PTP module 140*a*) and determines the time base for the PTP slave clocks lower in hierarchy.

In the example shown in FIG. 1, network 120_1 can be a transmitting network and one or more of the networks 120_2 to 120_N can be receiving networks. Network 120_1 can transmit data to one or more of the networks 120_2 to 120_N. In an aspect, network 120_1 being implemented as a transmitting network can function as a timing source and the rest of the networks 120_2 to 120_N can be synchronized to the timing source. In order for the data to be accurately transmitted to one or more of the networks 120_2 to 120_N, timing circuit 110 can synchronize the networks 120_1 to 120_N. When networks 120_1 is a transmitting network, transceivers 130*a* can recover a physical clock 111 from data being provided by network 120_1. In one embodiment, recovered physical clock 111 can be a SyncE physical clock signal. Transceiver 130*a* can send the recovered physical clock 111 to timing circuit 110. PTP module 140*a* can be implemented as a PTP slave module or PTP slave clock and can send a PTP phase 113 to timing circuit 110. PTP phase 113 can be an internal reference clock, such as a PTP phase clock signal. Timing circuit 110 can generate a 1 Pulse Per Second (1PPS) signal 119 using PTP phase 113. Timing circuit 110 can generate an output clock signal 117 that is frequency and/or phase locked with physical clock 111. Transceiver 130*b* can be configured to receive output clock signal 117 from timing circuit 110, where output clock signal 117 can be a SyncE transmit clock signal. The output clock signal 117, or SyncE transmit clock signal, can communicate a SyncE transmit clock for broadcasting the data provided by network 120_1 to one or more of the receiving networks 120_2 to 120_N.

PTP modules 140*a*, 140*b* can be configured to provide precise time over an Internet computing network. For example, PTP modules 140*a*, 140*b* can be interconnected by switches (e.g., dedicated, high-speed LAN segments interconnected by switches) and/or can synchronize device clocks over the Internet computing network. In the example shown in FIG. 1, PTP module 140*a* can implement a PTP slave module. PTP module 140*a*, as a PTP slave module, can send PTP phase 113 to timing circuit 110, where PTP phase 113 can be a PTP phase signal. PTP module 140*b* can implement a PTP master module. PTP module 140*b*, as a PTP master module, can receive 1PPS signal 119 that can be a 1PPS generated by timing circuit 110. Timing circuit 110 can use physical clock 111 and PTP phase 113 to generate output clock signal 117 and the 1PPS signal 119 can be used to synchronize the networks 120_1 to 120_N (e.g., a wide area network).

Figure 2:
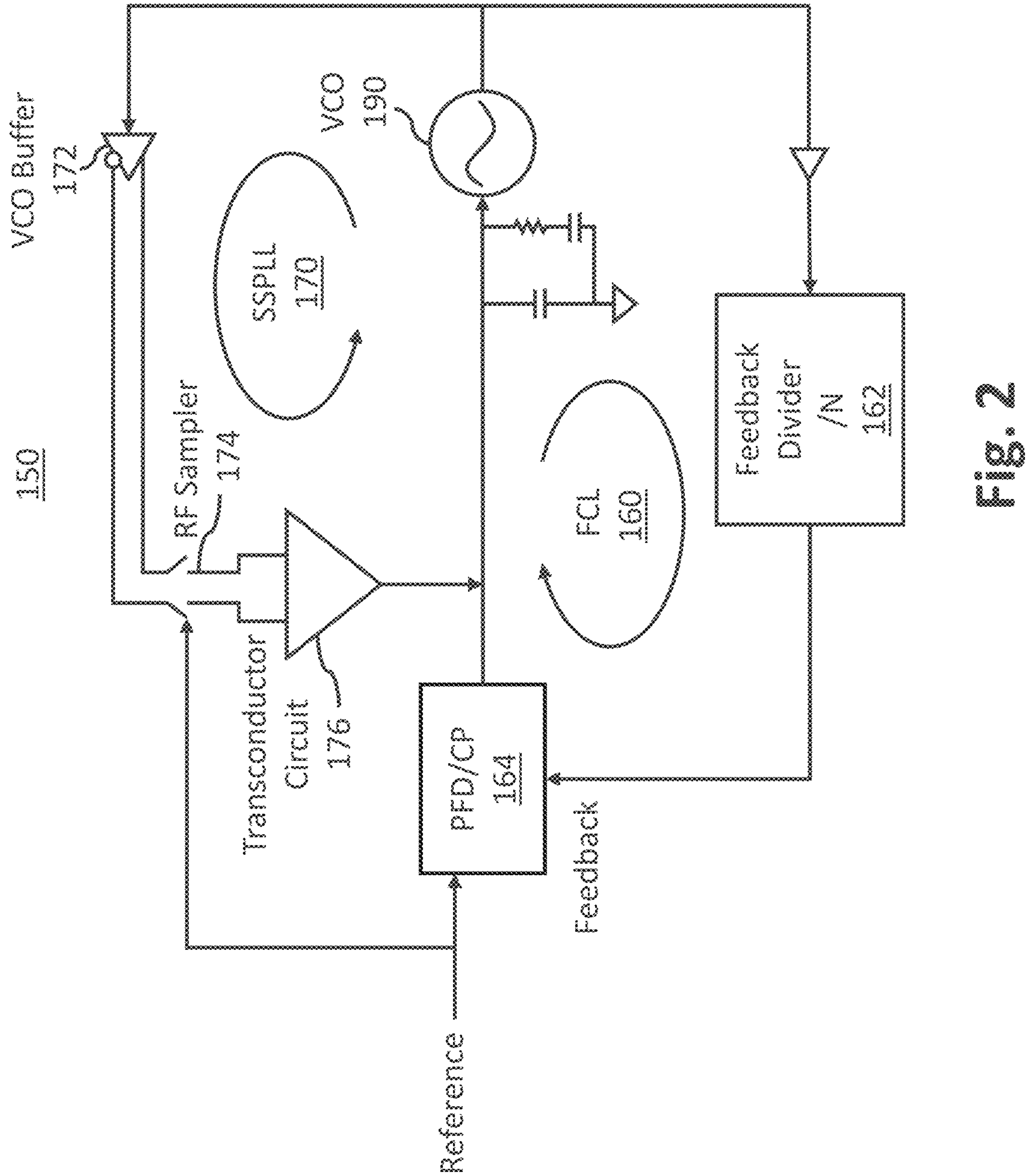
FIG. 2 is a circuit diagram of an example phase lock loop (PLL) of the timing circuit of the system of FIG. 1 in one embodiment.

With reference to FIGS. 1 and 2, timing circuit 110 implements a PLL 150 comprising a Frequency Correction Loop (FCL) 160, a sub-sampling PLL (SSPLL) 170 and a VCO 190. Each one of PLL 150, FCL 160, and SSPLL 170 can be implemented by one or more individual pieces of hardware that comprises physical components such as active and passive circuit components, logic circuits, integrated circuits, or the like. FCL 160 comprises a feedback divider 162 and a phase frequency detector/charge pump (PFD/CP) 164 or any other components commonly found in an FCL loop of a PLL. SSPLL 170 comprises a VCO Buffer 172, a radio frequency (RF) Sampler 174 and a transconductor circuit 176. SSPLL 170 may be utilized to frequency and phase lock the PLL by directly sampling VCO 190. This circumvents the need for the feedback divider 162 of FCL 160 to be constantly operational and removes the divider's power consumption and noise contribution from the PLL design when it is not active. In a SSPLL, the VCO can also be locked to a fraction of the reference frequency by sampling the VCO with a phase modulated reference frequency. The linearity of the sampling process may be much less stringent than the linearity required for a conventional PLL's charge pump and PFD because the phase modulation step is scaled by the fractional frequency and the unity feedback ratio, i.e., the quantization step is a fraction of the VCO period rather than a multiple. When using an SSPLL, the phase modulator may be linear to minimize harmonics of the fractional reference spur. The gain of a SSPLL may also be much higher than the gain of conventional PLLs because of the unity feedback ratio. This allows for much smaller bias currents, device sizes and reduced phase noise in the PLL circuitry and facilitates the design of PLLs with very high reference frequencies.

SSPLLs are often required to process very high speed clock edges from both the reference and the VCO buffer 172. The RF sampler circuit 174 must efficiently detect the relative phase of these two very high speed signals. In a practical power constrained SSPLL design, the RF sampler circuit 174 uses very small devices that have a correspondingly small drive capability. To avoid excessive loading of the RF sampler circuit 174, the input devices of the transconductor circuit 176 may also need to use small devices of typically minimum channel length to minimize loading on the RF sampler circuit 174 while maximizing the transconductance of transconductor circuit 176.

However, using transconductors having such small devices of typically minimum channel length to minimize loading on the RF sampler circuit presents some challenges. For example, the use of physically small transconductor input devices may cause large offsets at the input of the transconductor. When the SSPLL is in the locked state, the RF sampler circuit output will have to be imbalanced to counter these transconductor offsets. This imbalance may reduce the RF sampler circuit gain and may generate a static phase error at the error signal inputs to the transconductor from the RF sampler circuit. The transconductor output also connects to the VCO tuning voltage. Variations in the VCO control voltage may cause mismatches between the transconductor's sink and source currents and cause a further imbalance within the RF sampler circuit. The transconductor induced imbalances in the RF sampler circuit error signal outputs may also affect the digitally controlled delay (DCD) gain calibration circuit accuracy since these circuits also take the RF sampler circuit error signal outputs as their input. These inaccuracies in the DCD gain may cause higher spurs at the SSPLL outputs and lead to increased noise.

Figure 3:
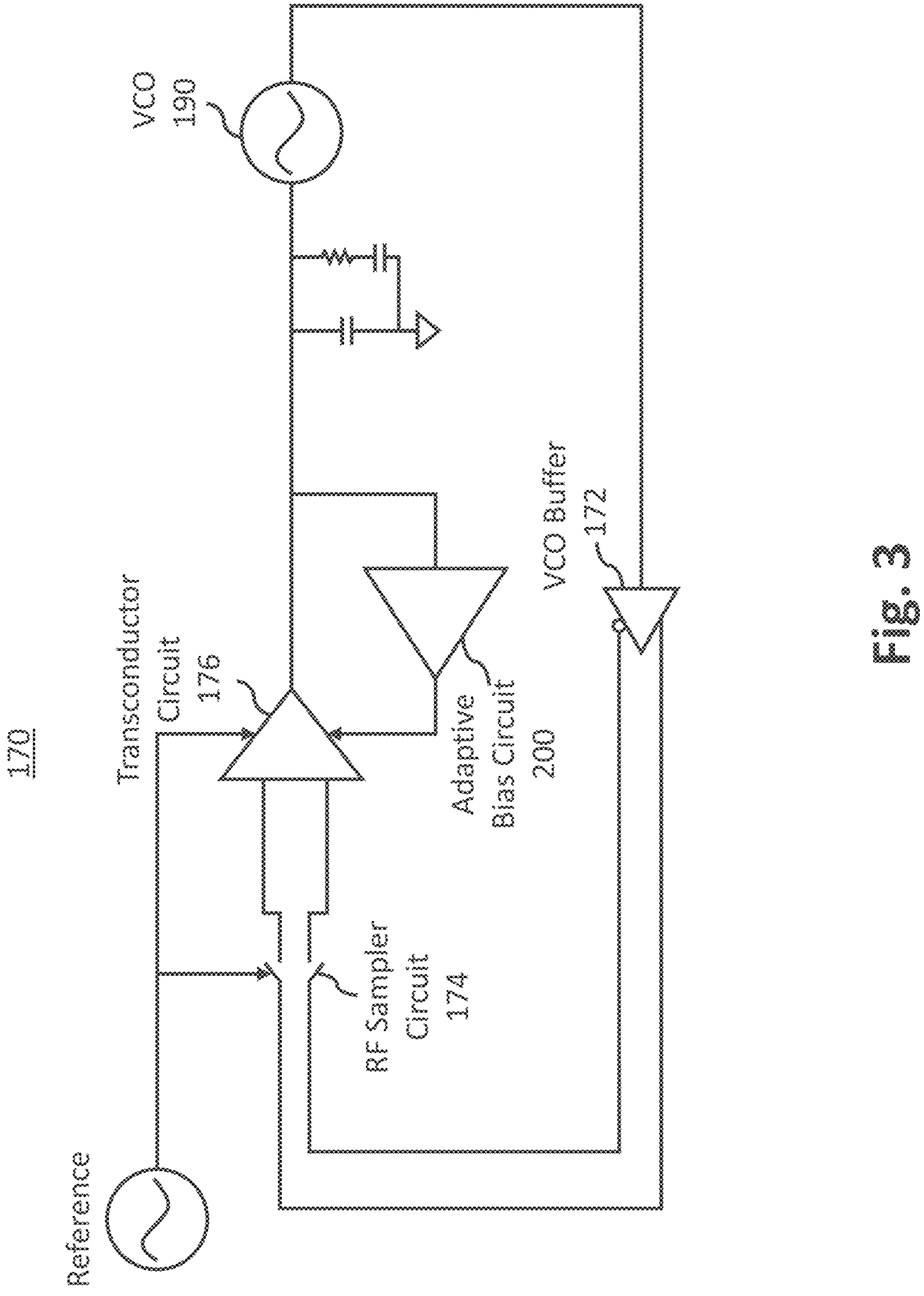
FIG. 3 is a circuit diagram of an example sub-sampling phase lock loop (SSPLL) of the PLL of FIG. 2 in one embodiment.
Figure 4:
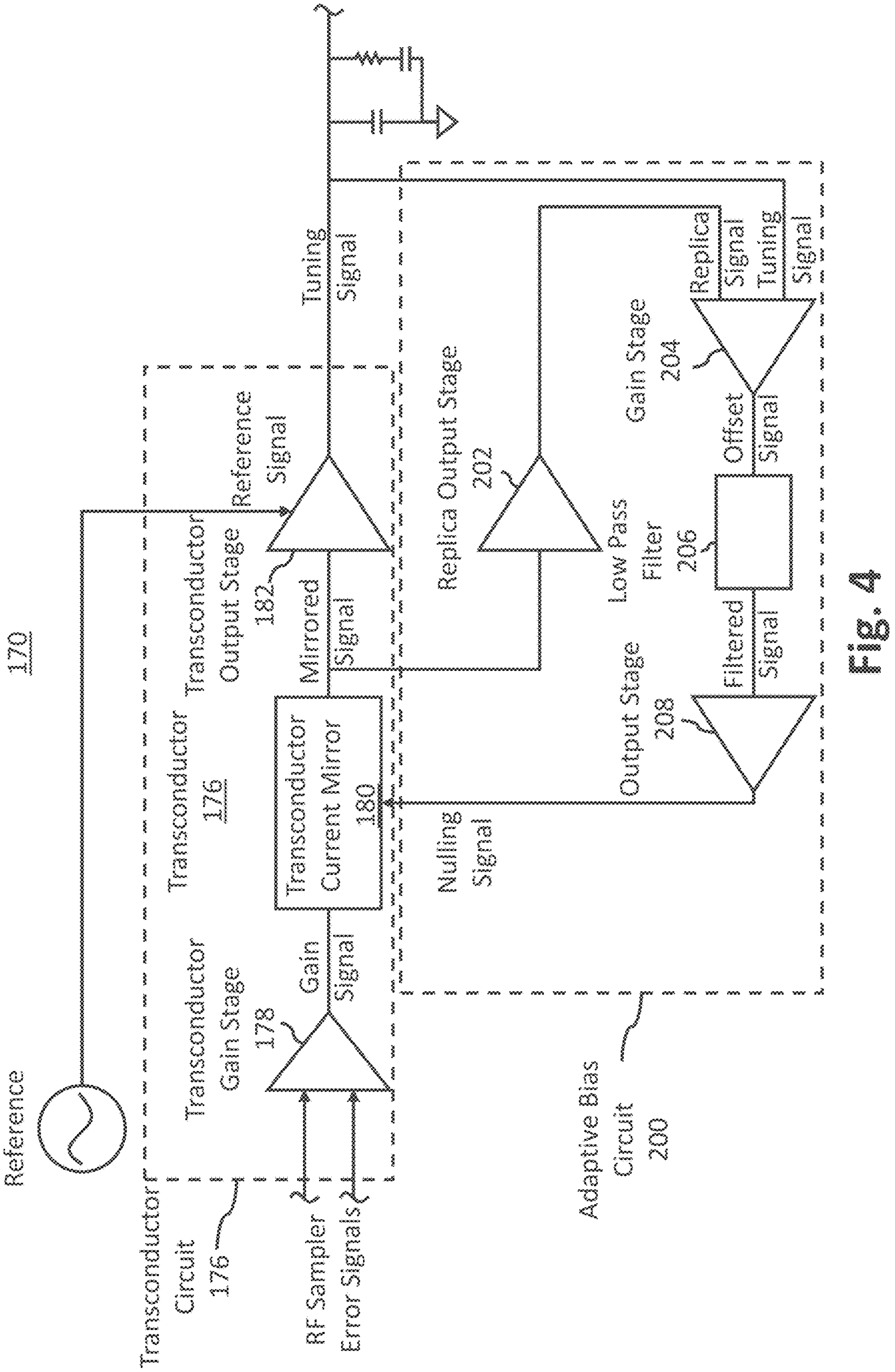
FIG. 4 is a circuit diagram of an example transconductor circuit and an example adaptive bias circuit of the SSPLL of FIG. 3 in one embodiment.

With reference to FIGS. 3 and 4, in one embodiment, SSPLL 170 is configured to reduce or entirely eliminate offsets within transconductor circuit 176 through the use of an adaptive bias circuit 200. Transconductor circuit 176 comprises a transconductor gain stage 178, a transconductor current mirror 180 and a transconductor output stage 182.

Transconductor gain stage 178 receives a pair of error signals that correspond to the phase difference between the reference signal and the output signal of VCO 190 from RF sampler circuit 174 as inputs. Transconductor gain stage 178 amplifies the error signals, e.g., using a differential amplifier, and outputs a gain signal to transconductor current mirror 180 that corresponds to the phase difference.

Transconductor current mirror 180 receives the gain signal from transconductor gain stage 178 and replicates the current of the gain signal as a mirrored output signal, e.g., to ensure that the current of the mirrored output signal is stable and can be accurately mirrored to transconductor output stage 182. For example, transconductor current mirror 180 may be utilized to provide a consistent and controlled current to transconductor output stage 182.

Transconductor output stage 182 receives the mirrored output signal and the reference signal as inputs and generates a tuning signal for output to the loop filter and VCO 190. VCO 190 then adjusts its output frequency based on the tuning voltage of the tuning signal which is fed back into RF sampler circuit 174 as the feedback signal, closing the loop.

Adaptive bias circuit 200 is configured to apply a nulling signal, e.g., a nulling current, to current mirror 180. Adaptive bias circuit 200 comprises a replica output stage 202, a gain stage 204, a low pass filter 206 and an output stage 208.

Replica output stage 202 receives the mirrored output signal from transconductor current mirror 180 as an input and generates a replica signal as an output that is utilized as a reference comparison for the tuning signal output by transconductor output stage 182 but does not include the dynamic switching of the reference signal input used for generating the tuning signal. For this reason, replica output stage 202 may comprise larger input devices than the input devices used for transconductor output stage 182 of transconductor circuit 176. The feedback to adaptive bias circuit 200 is the tuning signal output from the transconductor output stage 182.

Gain stage 204 receives the replica signal output of replica output stage 202 and the tuning signal output of transconductor output stage 182 as inputs. Gain stage 204 amplifies the replica signal and the tuning signal, e.g., using a differential amplifier, and outputs an offset signal to low pass filter 206 that corresponds to an offset, e.g., voltage, current, voltage and current, PVT or any other offset, between the replica signal and the tuning signal.

Low pass filter 206 filters out any noise on the offset signal and outputs a filtered signal to output stage 208.

Output stage 208 generates a nulling signal based on the filtered signal. The nulling signal is provided to transconductor current mirror 180. Transconductor current mirror 180 is configured to utilize the nulling signal to reduce or eliminate any offset that was found between the tuning signal output by transconductor output stage 182 and the replica signal output by replica output stage 202. For example, transconductor current mirror 180 may utilize the currents from both the gain signal and the nulling signal to generate the mirrored signal that is provided to transconductor output stage 182 where the newly mirrored signal is configured to reduce or eliminate the offset. In some embodiments, adaptive bias circuit 200 may eliminate the offset in one cycle. In other embodiments, multiple cycles may be utilized to reduce the offset and in some cases entirely eliminate the offset. This process of reducing and eliminating the offset in the tuning signal output by transconductor circuit 176 is performed within the analog PLL without the need for digital correction.

In this manner, adaptive bias circuit 200 is configured to track PVT variations in transconductor induced offsets in the tuning signal which enables adaptive bias circuit 200 to have a long transient settling time. The use of adaptive bias circuit 200 provides numerous benefits. For example, the noise from replica output stage 202 and gain stage 204 may be filtered out using low pass filter 206. In contrast, the output of transconductor output stage 182 is not typically filtered for noise. In another example, adaptive bias circuit 200 may also inhibit or avoid attenuating the transient response of transconductor circuit 176 to the error signal inputs from RF sampler circuit 174, for example, since the nulling signal is applied to transconductor current mirror 180 by adaptive bias circuit 200 to correct for the offsets caused by transconductor circuit 176. In some embodiments, the adaptive bias circuit 200 may also be implemented in a manner that inhibits adaptive bias circuit 200 from loading transconductor current mirror 180 by, for example, implementing a high output impedance and low capacitance in adaptive bias circuit 200 to avoid attenuating transconductor circuit 176's response to the error signal inputs from RF sampler circuit 174.

Figure 5:
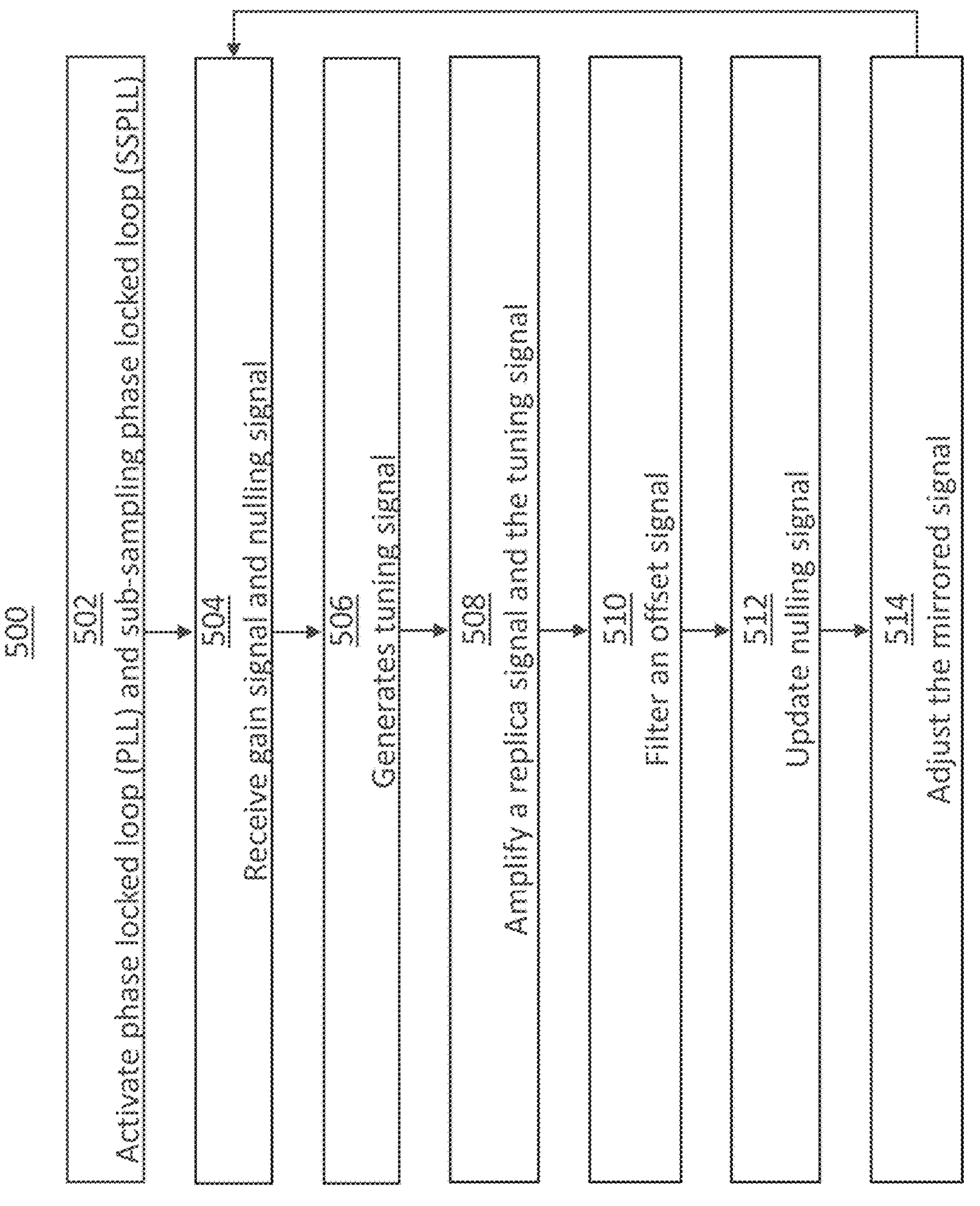
FIG. 5 is a flowchart of an example process that can implement a transconductor with adaptive bias offset cancellation in one embodiment.

FIG. 5 is a flowchart of an example process that can implement a PLL having a transconductor with adaptive bias offset cancellation in one embodiment. Process 500 in FIG. 5 may be implemented using, for example, timing circuit 110 discussed above. An example process may include one or more operations, actions, or functions as illustrated by one or more of blocks 502, 504, 506, 508, 510, 512 and/or 514. Although illustrated as discrete blocks, various blocks may be divided into additional blocks, combined into fewer blocks, eliminated, performed in different order, or performed in parallel, depending on the desired implementation.

Process 500 can be performed by a timing circuit (e.g., timing circuit 110). Process 500 can begin at block 502. At block 502, the timing circuit activates PLL 150 and SSPLL 170 with RF sampler circuit 174 sampling the VCO 190 via VCO buffer 172. RF sampler circuit 174 provides phase offset error signals as inputs to transconductor gain stage 178. Transconductor gain stage 178 amplifies the error signals, e.g., using a differential amplifier, and outputs a gain signal to transconductor current mirror 180 that corresponds to the phase difference.

Process 500 can proceed from block 502 to block 504. At block 504, transconductor current mirror 180 receives the gain signal from transconductor gain stage 178 and a nulling signal from adaptive bias circuit 200 and generates a mirrored output signal, e.g., mirroring a current of the gain signal that is adjusted by a current of the nulling signal. Transconductor current mirror 180 provides the mirrored signal to transconductor output stage 182 and to replica output stage 202.

Process 500 can proceed from block 504 to block 506. At block 506, transconductor output stage 182 generates a tuning signal based on the mirrored signal and the reference signal and provides the tuning signal to VCO 190. Replica output stage 202 of adaptive bias circuit 200 also generates a replica signal that corresponds to the output signal of transconductor output stage 182. The tuning signal and replica signal are also provided to gain stage 204 of adaptive bias circuit 200.

Process 500 can proceed from block 506 to block 508. At block 508, gain stage 204 of adaptive bias circuit 200 amplifies the replica signal and the tuning signal, e.g., using a differential amplifier, and outputs an offset signal to low pass filter 206 that corresponds to an offset, e.g., voltage, current, voltage and current, PVT or any other offset, between the replica signal and the tuning signal.

Process 500 can proceed from block 508 to block 510. At block 510, the offset signal from gain stage 204 is filtered by low pass filter 206 to remove unwanted noise. Low pass filter 206 provides a filtered signal to output stage 208.

Process 500 can proceed from block 510 to block 512. At block 512, output stage 208 generates or updates the nulling signal based on the filtered signal and provides the nulling signal to transconductor current mirror 180.

Process 500 can proceed from block 512 back to block 504. At block 504, transconductor current mirror 180 receives an updated gain signal and the nulling signal and continues to adjust the mirrored signal based on updated gain signal and the nulling signal. The adjusted mirrored signal is provided to transconductor output stage 182 and is configured to reduce or entirely eliminate the offset found in the tuning signal.

Process 500 continuously updates the nulling signal based on the offset determined between the tuning signal and the replica signal to reduce or entirely eliminate the offset induced by transconductor circuit 176.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising a timing circuit, the timing circuit comprising:

a sub-sampling phase lock loop comprising:

a radio frequency sampler circuit that is configured to generate at least one error signal corresponding to a phase difference between an output signal of a voltage-controlled oscillator and a reference signal;

a transconductor circuit that is configured to generate a tuning signal based on the at least one error signal, the tuning signal being configured to tune the voltage-controlled oscillator; and an adaptive bias circuit that is configured to:

generate a nulling signal based on an offset in the tuning signal created by the transconductor circuit; and provide the nulling signal to the transconductor circuit, the transconductor circuit being configured to adjust the tuning signal based on the nulling signal.

2. The semiconductor device of claim 1, wherein:

the transconductor circuit comprises a transconductor output stage, the transconductor output stage being configured to generate the tuning signal based on the at least one error signal and the reference signal;

the adaptive bias circuit comprises a replica output stage, the replica output stage being configured to generate a replica signal based on the at least one error signal;

the adaptive bias circuit is configured to generate an offset signal based on the tuning signal and the replica signal; and the adaptive bias circuit is configured to generate the nulling signal based on the offset signal.

3. The semiconductor device of claim 2, wherein the adaptive bias circuit comprises a gain stage, the gain stage being configured to generate the offset signal based on the tuning signal and the replica signal.

4. The semiconductor device of claim 2, wherein:

the adaptive bias circuit comprises a low pass filter, the low pass filter being configured to filter noise from the offset signal to generate a filtered signal; and the adaptive bias circuit is configured to generate the nulling signal based on the filtered signal.

5. The semiconductor device of claim 4, wherein the adaptive bias circuit comprises a bias output stage, the bias output stage being configured to generate the nulling signal based on the filtered signal.

6. The semiconductor device of claim 2, wherein at least one component of the replica output stage is larger than at least one corresponding component of the transconductor output stage.

7. The semiconductor device of claim 1, wherein the adaptive bias circuit is configured to provide the nulling signal to a current mirror of the transconductor circuit, the current mirror being configured to generate a mirrored signal based on the nulling signal and the at least one error signal, the transconductor circuit being configured to generate the tuning signal based on the mirrored signal.

8. The semiconductor device of claim 1, wherein the adaptive bias circuit is an analog circuit.

9. A timing circuit comprising:

a transconductor circuit that is configured to generate a tuning signal based on at least one error signal corresponding to a phase difference between a reference signal and an output signal of a voltage-controlled oscillator, the tuning signal being configured to tune the voltage-controlled oscillator; and an adaptive bias circuit that is configured to:

generate a nulling signal based on an offset in the tuning signal created by the transconductor circuit; and provide the nulling signal to the transconductor circuit, the transconductor circuit being configured to adjust the tuning signal based on the nulling signal.

10. The timing circuit of claim 9, wherein:

the transconductor circuit comprises a transconductor output stage, the transconductor output stage being configured to generate the tuning signal based on the at least one error signal and the reference signal;

the adaptive bias circuit comprises a replica output stage, the replica output stage being configured to generate a replica signal based on the at least one error signal;

the adaptive bias circuit is configured to generate an offset signal based on the tuning signal and the replica signal; and the adaptive bias circuit is configured to generate the nulling signal based on the offset signal.

11. The timing circuit of claim 10, wherein the adaptive bias circuit comprises a gain stage, the gain stage being configured to generate the offset signal based on the tuning signal and the replica signal.

12. The timing circuit of claim 10, wherein:

the adaptive bias circuit comprises a low pass filter, the low pass filter being configured to filter noise from the offset signal to generate a filtered signal; and the adaptive bias circuit is configured to generate the nulling signal based on the filtered signal.

13. The timing circuit of claim 12, wherein the adaptive bias circuit comprises a bias output stage, the bias output stage being configured to generate the nulling signal based on the filtered signal.

14. The timing circuit of claim 10, wherein at least one component of the replica output stage is larger than at least one corresponding component of the transconductor output stage.

15. The timing circuit of claim 9, wherein the adaptive bias circuit is configured to provide the nulling signal to a current mirror of the transconductor circuit, the current mirror being configured to generate a mirrored signal based on the nulling signal and the at least one error signal, the transconductor circuit being configured to generate the tuning signal based on the mirrored signal.

16. The timing circuit of claim 9, wherein the adaptive bias circuit is an analog circuit.

17. A semiconductor device comprising a phase lock loop of a timing circuit, the phase lock loop comprising:

a voltage-controlled oscillator that is configured to generate an output signal of the phase lock loop; and a sub-sampling phase lock loop, the sub-sampling phase lock loop comprising:

a radio frequency sampler circuit that is configured to obtain the output signal of the voltage-controlled oscillator and a reference signal and to generate a pair of error signals corresponding to a phase difference between the output signal and the reference signal;

a transconductor circuit comprising:

a gain stage that is configured to generate a gain signal based on the pair of error signals;

a current mirror that is configured to generate a mirrored signal; and an output stage that is configured to generate a tuning signal based on the mirrored signal and the reference signal, the voltage-controlled oscillator being configured to generate the output signal based on the tuning signal; and an adaptive bias circuit comprising:

a replica output stage, the replica output stage being configured to generate a replica signal based on the mirrored signal;

a gain stage that is configured to generate an offset signal based on the tuning signal and the replica signal;

a low pass filter that is configured to generate a filtered signal based on the offset signal; and an output stage that is configured to generate a nulling signal based on the filtered signal, the current mirror being configured to generate the mirrored signal based on a current of the nulling signal and a current of the gain signal.

18. The semiconductor device of claim 17, wherein at least one component of the replica output stage is larger than at least one corresponding component of the output stage.

19. The semiconductor device of claim 17, wherein the adaptive bias circuit is an analog circuit.

20. The semiconductor device of claim 17, wherein the adaptive bias circuit is configured to reduce an imbalance in the pair of error signals output by the radio frequency sampler circuit that are induced by components of the transconductor circuit.

* * * * *